United States Patent
Kickel et al.

(10) Patent No.: US 6,573,141 B1
(45) Date of Patent: Jun. 3, 2003

(54) IN-SITU ETCH AND PRE-CLEAN FOR HIGH QUALITY THIN OXIDES

(75) Inventors: Bernice L. Kickel, Boise, ID (US); John A. Smythe, III, Boise, ID (US)

(73) Assignee: ZiLOG, Inc., San Jose, CA (US)

( * ) Notice: Subject to any disclaimer, the term of this patent is extended or adjusted under 35 U.S.C. 154(b) by 0 days.

(21) Appl. No.: 09/267,327

(22) Filed: Mar. 12, 1999

(51) Int. Cl.$^7$ ............................................. H01L 21/336
(52) U.S. Cl. ........................ 438/264; 438/756; 438/770; 438/594
(58) Field of Search ................................. 438/264, 257, 438/258, 263, 266, 593, 594, 770, 756, 787

(56) References Cited

U.S. PATENT DOCUMENTS

| | | | | |
|---|---|---|---|---|
| 4,693,779 A | * | 9/1987 | Okuhira et al. | 156/345 |
| 4,917,123 A | * | 4/1990 | McConnell et al. | 134/95 |
| 4,982,753 A | * | 1/1991 | Grebinski et al. | 134/95 |
| 5,288,333 A | * | 2/1994 | Tanaka et al. | 134/31 |
| 5,538,923 A | | 7/1996 | Gardner et al. | 438/264 |
| 5,589,412 A | * | 12/1996 | Iranmanesh et al. | 438/264 |
| 5,591,299 A | * | 1/1997 | Seaton et al. | 156/345 |
| 5,695,661 A | * | 12/1997 | Rasmussen et al. | 216/97 |
| 5,744,391 A | * | 4/1998 | Chen | 438/264 |
| 5,785,875 A | * | 7/1998 | Hawthorne et al. | 216/41 |
| 5,811,334 A | * | 9/1998 | Buller et al. | 438/264 |
| 5,817,557 A | * | 10/1998 | Baldi | 438/264 |
| 5,869,405 A | * | 2/1999 | Gonzalez et al. | 438/770 |
| 5,950,645 A | * | 9/1999 | Olesen et al. | 134/98.1 |
| 6,063,712 A | * | 5/2000 | Gilton et al. | 438/756 |

OTHER PUBLICATIONS

Brugge, Hunter B., et al.; "Optimization of pre–gate clean technology for a 0.35 μm dual–oxide/dual–voltage CMOS process"; *Proceedings of SPIE,* vol. 3212; Oct. 1–2, 1997; Austin, Texas; pp. 52–60.

Iwamoto, Toshiyuki, et al.; "Influence of carbon contamination on ultra thin gate oxide reliability", *Microelectronic Device and Multilevel Interconnection Technology II,* vol. 2875; Oct. 16–17, 1996; Austin, Texas; pp. 207–215.

Cady, W.A. and M. Varadarajan; "RCA Clean Replacement"; *Journal of The Electrochemical Society;* vol. 143, No. 6; Jun. 1996; pp. 2064–2067.

Lai, Kafai, et al.; "Effects of Surface Preparation on the Electrical and Reliability Properties of Ultrathin Thermal Oxide"; *IEEE Electron Device Letters;* vol. 15, No. 11; Nov. 1994; pp. 446–448.

Buller, J.F., et al.; "Improved EEPROM Tunnel– and Gate–Oxide Quality By Integration of a Low–Temperature Pre–Tunnel–Oxide RCA SC–1 Clean"; *IEEE Semiconductor Manufacturing;* vol. 9, No. 3; Aug. 1996; pp. 471–476.

\* cited by examiner

*Primary Examiner*—Michael Trinh
(74) *Attorney, Agent, or Firm*—Parsons Hsue & de Runtz LLP (57) ABSTRACT

The present invention provides a method for improving the quality of thin oxides formed upon a semiconductor body. The etch and pre-clean processes are performed in situ, taking place in a single apparatus. This reduces the amount of handling of the wafers, their exposure to clean room air, and time delays between clean and oxidation. This results in both a higher yield and greater reliability. In addition, it reduces equipment requirements. The etch, employing a buffered oxide etchant, resist strip, and pre-clean, all occur in a single apparatus without transfer, yielding better results, despite the inherently dirty nature of the resist strip, than the traditional technique of transferring to a new apparatus for each of these steps. The improvements are particularly important for thin oxides such as the tunnel oxides of EEPROMs.

2 Claims, 10 Drawing Sheets

IN-SITU ETCH AND PRE-CLEAN FOR HIGH QUALITY THIN OXIDES

BACKGROUND OF THE INVENTION

This invention relates generally to the fabrication of semiconductor devices and in particular to high-quality thin oxides formed on the surface of a semiconductor substrate.

The ability to manufacture high-quality oxides is of extreme importance in the production of semiconductor devices. As the need for ever thinner oxides has increased, the requirement for major improvements to obtain reliable ultra-thin oxide films has become vital. This is especially true in the tunnel oxides of Electrically Erasable Programmable Read-Only Memories (EEPROMs), where the oxide may be less than 100 Å thick. In order to improve these oxides, all phases of their manufacture continue to be examined for possible improvements.

In the silicon wafer production process, manufacturers use many differing procedures: however, these generically follow a standard series of steps including 0. Initial substrate clean
1. EEPROM oxidation
2. Mask and etch
3. Resist strip
4. Oxidation pre-clean
   a) SC1
   b) SC2
5. Form (oxidation) thin oxide
6. Polysilicon or amorphous silicon deposition and doping.

Here SC1 and SC2 refer to Standard (also known as RCA) Clean 1 and 2. SC1 is used to remove organic materials and traditionally consists of a mixture of $NH_4OH/H_2O_2/H_2O$ in the concentration ratios of 1:1:5. SC2 is for removing metallic contaminants, and traditionally is the mixture $HCl/H_2O_2/H_2O$, again in the concentration ratios of 1:1:5. Various water rinse and drying stages in between these steps are not shown.

Again, this is only the outline of the standard procedure. Due to the importance of high-quality thin oxides, many variations in the etch and pre-clean have been explored. The concentrations and compositions, times and temperatures, and order of steps are all parameters that have been studied and modified searching for improvements. Common variations include also having a HF pre-clean stage in addition to, or replacing, the RCA cleans.

The mask and etch step is done using a photoresist layer. This forms the patterned mask that determines those areas of oxide removed during the etch. The subsequent need to remove this photoresist and provide the cleanest possible surface for the thin gate oxidation is the purpose of the pre-clean. As the stripping of the photoresist is an inherently dirty process, the wafers are typically transferred to an additional piece of equipment to remove the resist layer, then transferred again, usually to a wet deck, for the last pre-clean step. This transference has been considered necessary for the best result during this important cleaning stage. Although this cleaning then takes place in a cleaner environment, the use of different apparatus in steps 2 through 4b unavoidably increases handling of the wafers, exposure to cleanroom air, and sit time between the clean and oxidation. This handling and exposure are detrimental to the wafers. In addition, this transference requires distinct pieces of equipment.

It is the primary object of the present invention to improve the quality of thin oxides by overcoming these limitations resulting from the amount of handling of the wafers, their exposure to cleanroom air, and time delays between clean and oxidation.

It is another object to accomplish these results with a reduction in the amount of apparatus required for processing the silicon wafers.

SUMMARY OF THE INVENTION

These and additional objects are accomplished by the various aspects of the present invention, wherein, briefly and generally, according to one such aspect, the etch and pre-clean processes of forming a high-quality thin oxide are performed in situ. A patterned silicon wafer is placed in the apparatus ready to be etched and is then removed directly to a furnace for a further oxidation step, the wet etch, the photoresist removal, and pre-clean occurring, in a sequential process within a single apparatus. This results in less handling of the wafer, a decrease in processing time, and, consequently, less exposure to cleanroom air. The result is an oxide of higher quality, as expressed in measures such as the charge to break down, $Q_{BD}$, a measure of the maximum charge which may be placed across the oxide layer.

According to another aspect of the present invention, the amount of processing apparatus is reduced. By combining the etch, resist removal, and pre-clean steps, a single apparatus performs these processes in situ, thereby reducing equipment requirements.

In a further aspect, by a suitable choice of parameters and the use of a Buffered Oxide Etchant (BOE), higher wafer yields and reliability are obtained.

All these aspects are important in the manufacturing process of ultra-thin oxide layers, such as those required in the tunnel oxides of Electrically Erasable Programmable Read-Only Memories (EEPROMs) and other semiconductor devices. Additional objects, advantages, and features of the present invention will become apparent from the following( description of its preferred embodiments, which description should be taken in conjunction with the accompanying drawings.

DESCRIPTION OF THE PREFERRED EMBODIMENTS

The present invention performs in situ etch, resist removal, and pre-clean processes in the manufacture of a high-quality, ultra-thin oxide layer on the surface of a semiconductor. Despite the inherently dirty nature of stripping the photoresist, a higher quality oxide results by executing these steps sequentially within a single apparatus. For specificity, the discussion below is in terms of a preferred embodiment, the tunnel oxide of an Electrically Erasable Programmable Read-Only Memory (EEPROM), but the techniques involved could also be used for Dynamic Random Access Memories (DRAMs), high-speed basic logic functions, or other applications needing such oxides.

Figure 1A:
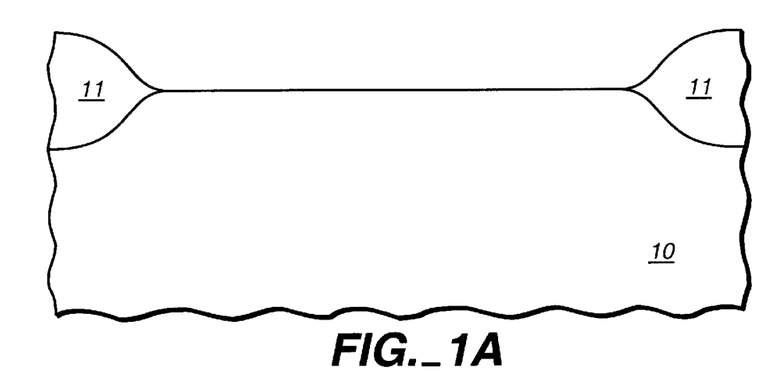
FIGS. 1a through 1f are a cross-sectional view of different steps in the process.
Figure 1B:
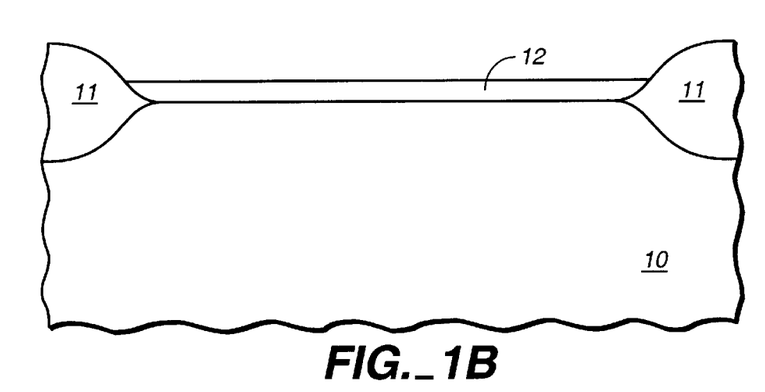
Figure 1C:
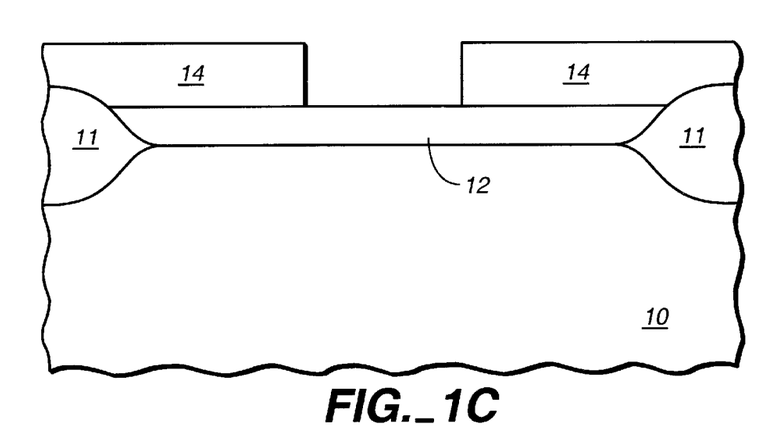
Figure 1D:
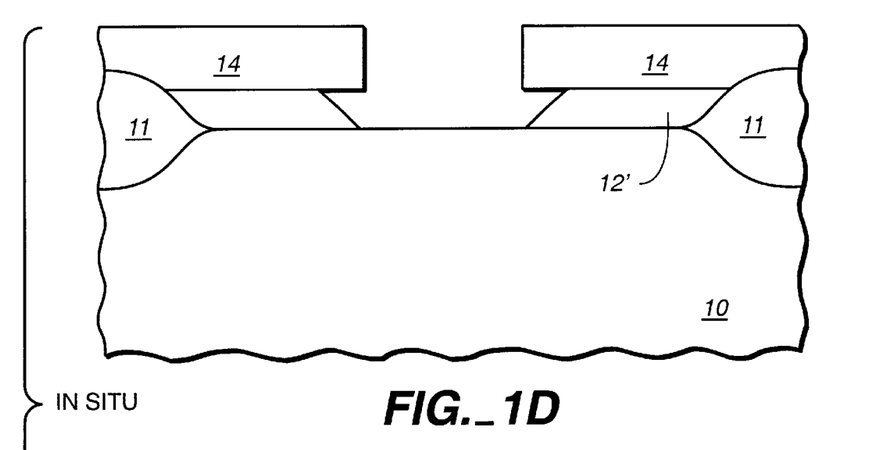
Figure 1E:
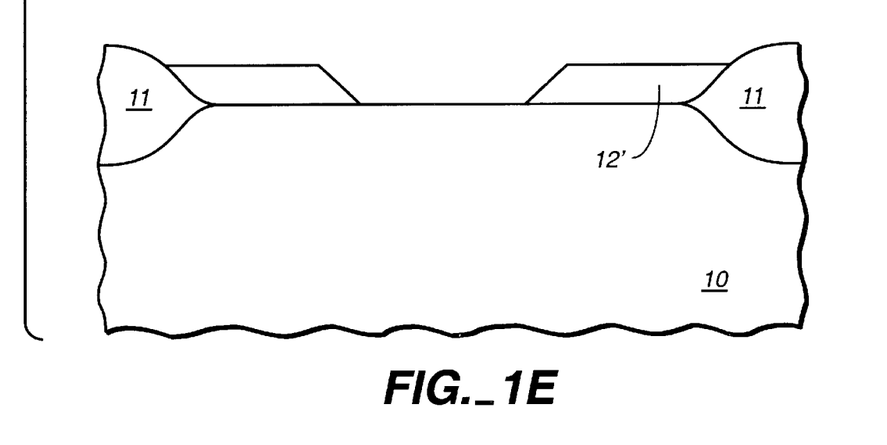
Figure 1F:
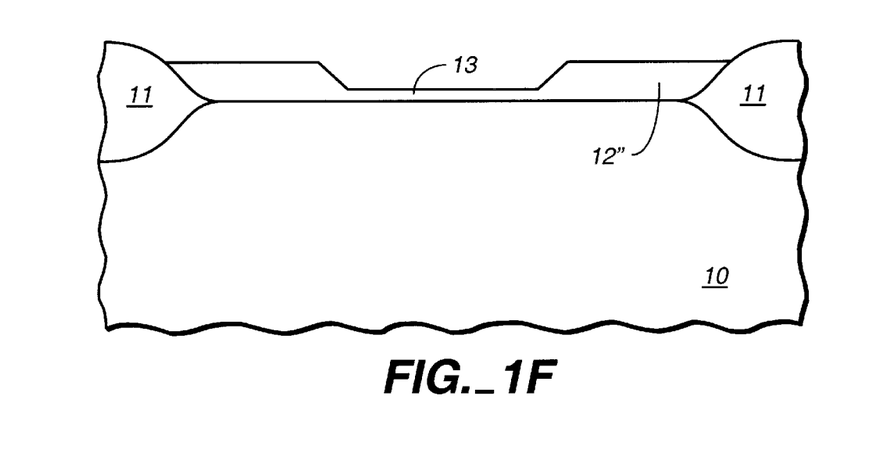

FIGS. 1a through 1f show the silicon wafer at the different stages of the process in the preferred embodiment. FIG. 1a is the basic silicon substrate 10, where for an EEPROM the field oxides 11 are already in place. Upon substrate 10 an oxide layer 12, here about 300 Å thick, is grown in FIG. 1b. Upon this is placed a patterned photoresist 14 as in FIG. 1c, which leaves exposed the areas to be etched. The etch is performed using a Buffered Oxide Etchant (BOE, also called buffered HF). FIG. 1d is the result of the etch, showing the result oxide layer 12'. In FIG. 1e the resist is stripped away and the wafer pre-cleaned. Finally, FIG. 1f shows the oxide 12' regrown to produce the tunnel oxide 13 of the preferred embodiment. In this embodiment, the tunnel portion of the oxide is less than 100 Å thick and is approximately 0.6 $\mu$m wide, the total EEPROM oxide being about 1.8 $\mu$m in width.

As discussed above, these particular steps, or variations upon them, are fairly standard. The novelty of the current invention is the combination of the etch, resist removal, and pre-clean steps: the wafer is subjected to these processes in situ, within a single apparatus. It goes in as shown in FIG. 1c and comes out ready for the tunnel oxide of FIG. 1f to be grown. Although it is always desirable to reduce the amount of handling and exposure to cleanroom air that the wafers suffer, it is unexpected that the improvement from this combined process would more than offset the resulting detrimental effects to the pre-clean phase. This is the non-obvious result of the current invention.

Figure 2:
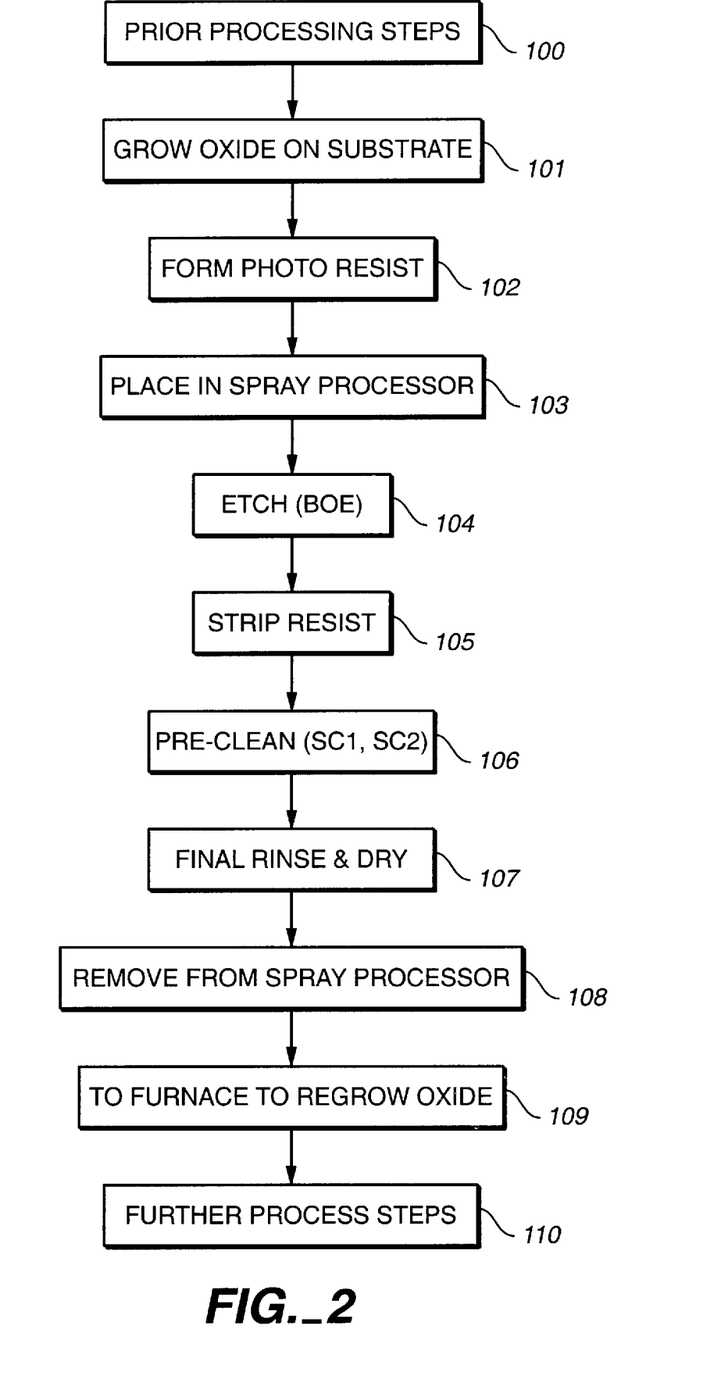
FIG. 2 is a flow chart of the process.

FIG. 2 is a flow chart to briefly illustrate both the process itself and where this process diverges from the prior art. In step 101, an oxide layer is grown upon the substrate. Over this is placed the photoresist in step 102. The end result of this pair of steps corresponds, respectively, to FIGS. 1b and 1c. At this point the wafer is ready to go into the spray machine for processing. Step 103 places the wafer in this machine where steps 104–107, the etch, resist strip, and pre-cleans, all occur. At step 108 the wafer is removed, ready to go to the furnace in step 109 to have the thin oxide grown. The details of these steps will be given below, but the important point here is that steps 104 through 107 all take place in situ within this single apparatus: the wafer goes in as shown in FIG. 1c and comes out as in FIG. 1e. The practice of the prior art is to remove the wafer between steps 105 and 106 in a step, say, 105.5, that would transfer it to a wet deck or other machine in order to continue on to step 106. It is also common in the prior art to transfer the wafer between steps 104 and 105 in a step 104.5, further increasing the amount of apparatus required.

The improvements in the oxides produced by this process are discussed first. The specifics of the process in a preferred embodiment follow. Finally, the thin oxide is placed in a particular environment, an EEPROM, where the requirement of such high-quality ultra-thin layers is vital.

Figure 3A:
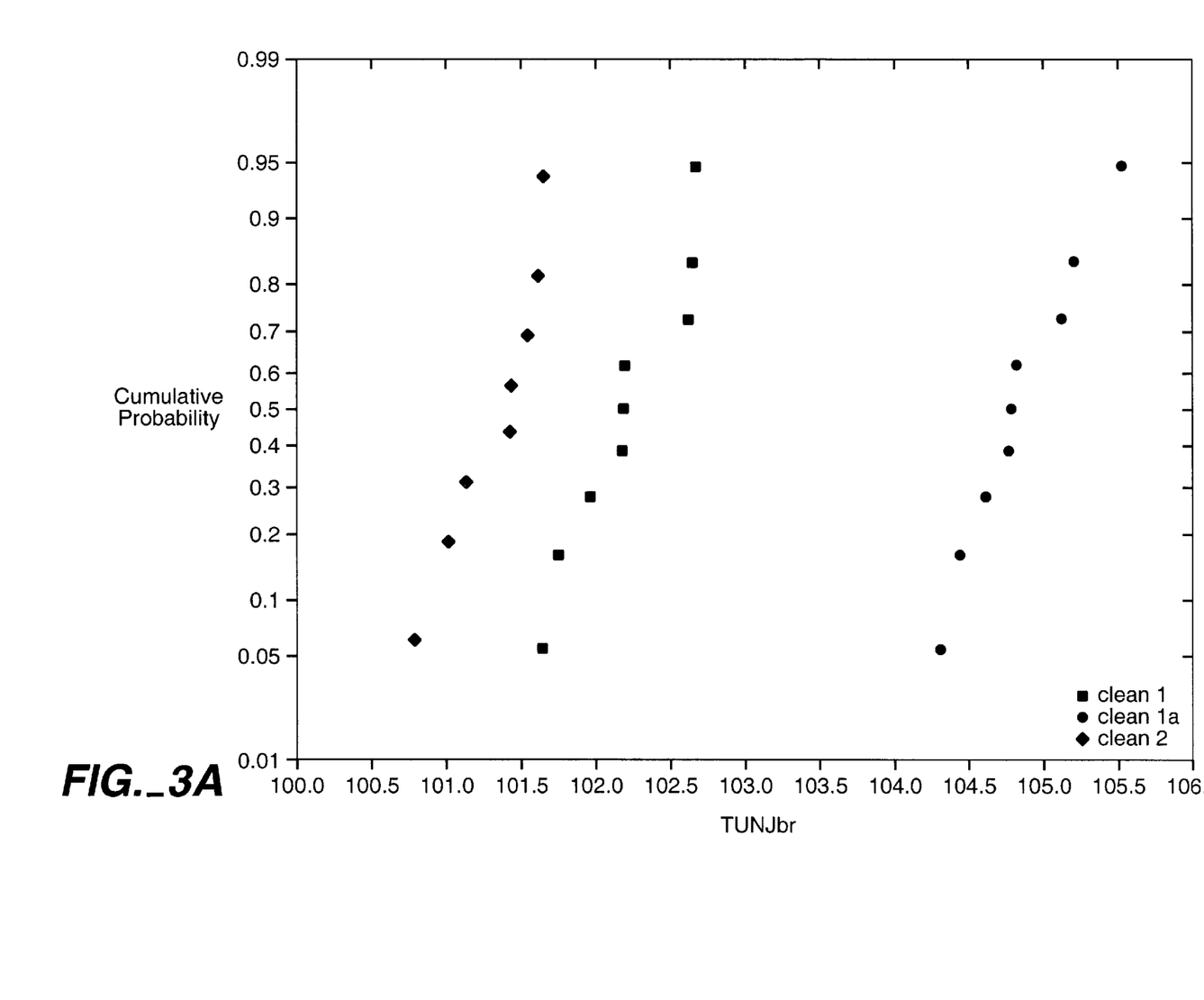
FIGS. 3a through 3c present data comparing the process of the present invention with that of the prior art.
Figure 3B:
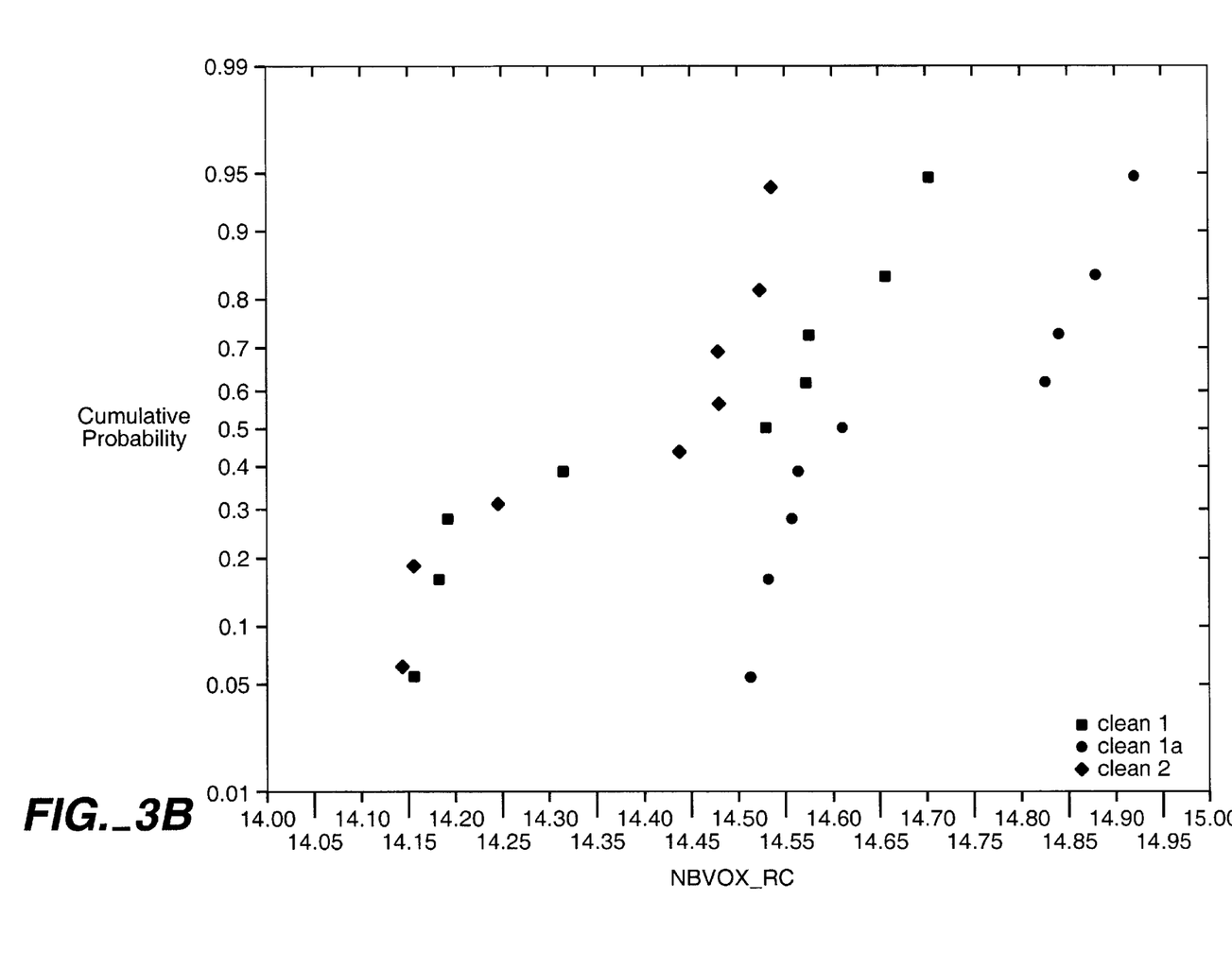
Figure 3C:
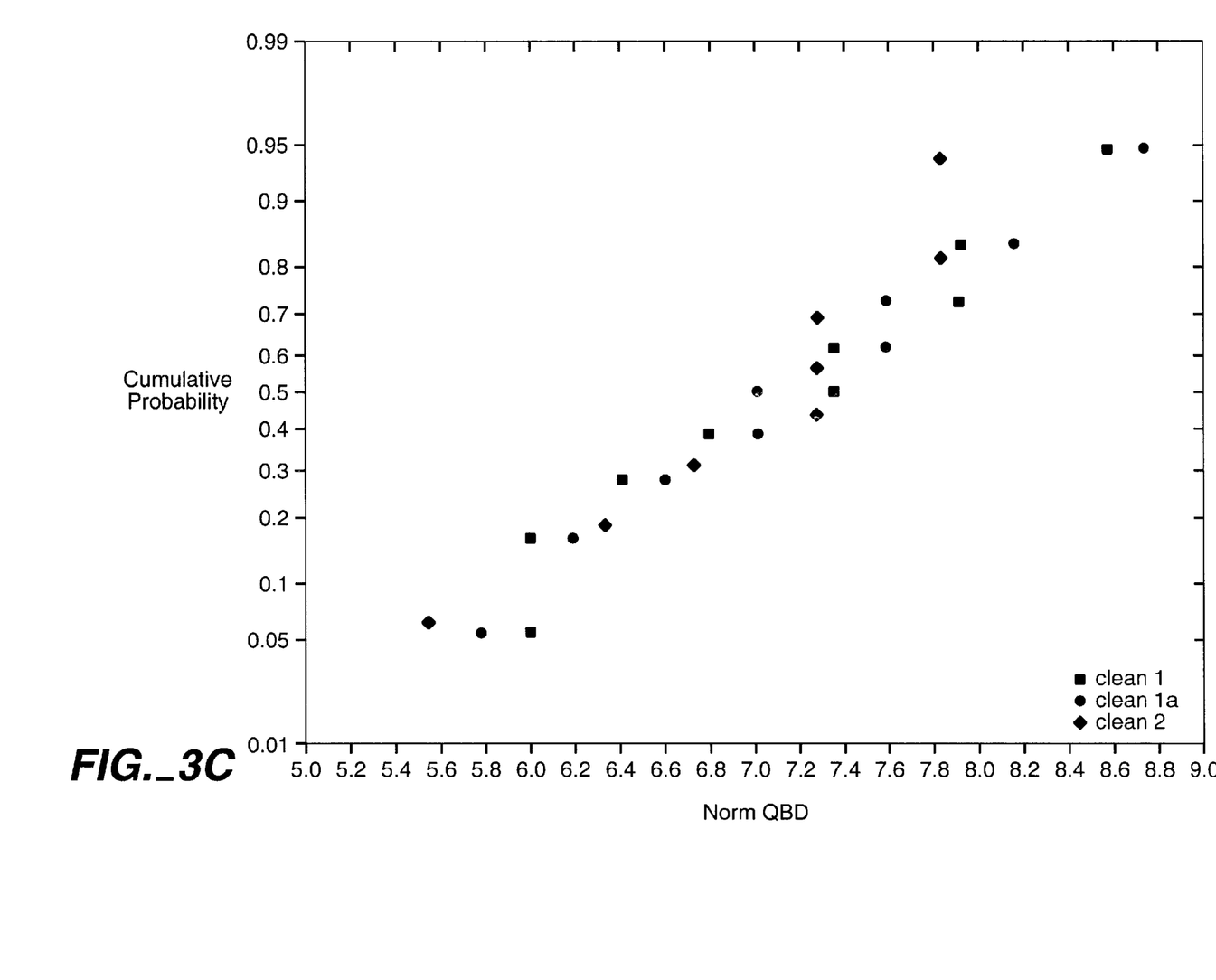

FIGS. 3a, 3b, and 3c show data for several variations on etch and pre-clean procedures. Clean 1 takes place in situ, with the BOE etch and subsequent pre-clean both occurring within a spray processor. In Clean 2, after the resist is stripped, the wafers are transferred to a wet deck for cleaning. Table 1 gives the outline of these three variations of the etch and pre-clean phase of fabrication. Cleans 1 and 1a are an embodiment of the current invention and are discussed more below, while Clean 2 is an example of the prior art. For comparing data, Clean 1 is used as it differs from Clean 2 only in the transfer to the wet deck. This pair can be considered as a sort of reference embodiment of the present invention and the prior art, respectively, both having a pre-clean phase consisting just SC1 followed by SC2.

TABLE 1

| Clean 1 | Clean 1a | Clean 2 |
|---|---|---|
| wet processing: | wet processing: | wet processing: |
| BOE | BOE | BOE |
| resist strip | resist strip | resist strip |
| SC1 | SC1 | Transfer |
| SC2 | HF | wet processing: |
|  | SC2 | resist strip |
|  |  | SC1 |
|  |  | SC2 |

FIGS. 3a, 3b, and 3c show breakdown current density, tunnel oxide breakdown voltage, and normalized charge to break down, respectively, for the different cleans. In all three cases, the data points of Clean 1 lie to the right of those from Clean 2. These higher values for all three of these measurements, as most easily noted in FIG. 3a, show the invention as an improvement over the prior art. The values for the embodiment of Clean 1a are even better than for Clean 1 due to the additional HF stage between SC1 and Sc2, but Clean 1 is the preferred embodiment since it is a simpler process and yields comparable results.

Summarizing $Q_{BD}$ by clean condition, the improved values are seen in Table 2. Again, the most direct comparison is between in situ process Clean 1 and prior art process Clean 1.

TABLE 2

| Clean 1 | Breakdown Voltage | $Q_{BD}$ (C/cm$^2$) |
|---|---|---|
| 1 | 11.6 ± 0.1 | 7.2 ± 0.9 |
| 1a | 11.8 ± 0.2 | 7.2 ± 0.9 |
| 2 | 11.2 ± 0.0 | 6.7 ± 0.8 |

Another advantage of the in situ etch and pre-clean is a reduction in the amount of apparatus needed to process wafers. The purpose of the transfer to a wet deck or other second device in the prior art, such as Clean 2, was to exploit the better pre-clean obtained in the wet deck. But by looking at the etch/resist strip/pre-clean process as a whole, the improved quality of the combined in situ processing removes the motivation for this transfer and, hence, the need for the additional apparatus.

Clean 1 is now considered in more detail. This embodiment is based on the basic SC1 followed by SC2 pre-clean and, as mentioned above, for that reason can be treated as a sort of reference embodiment. It is also the preferred embodiment. Approximate values of the parameters are given are given in Table 3. The values given in this preferred embodiment are all with respect to the apparatus used, an FSI Mercury MP Surface Conditioning System. Given the importance of the pre-clean stage, many of the variations found in the literature are possible, either in times for the rinse and clean stages or in the inclusion of other clean stages in addition to, or instead of, the given SC1/SC2 combination.

TABLE 3

| Step | Time (seconds) |
|---|---|
| BOE dispense (50:1) | 217–257 |
| Rinse (deionized filtered water) | 225 |
| resist strip ($H_2SO_4$—$H_2O_2$) | 550 |
| Rinse | 480 |

TABLE 3-continued

| Step | Time (seconds) |
|---|---|
| SC1 ($NH_4OH/H_2O_2/H_2O$) | 235 |
| Rinse | 310 |
| SC2 ($HCl/H_2O_2/H_2O$) | 110 |
| Final Rinse | 460 |
| Dry | 440 |

BOE is used due to its more stable etch characteristics. Unbuffered HF causes both excessive undercutting at the resist oxide interface and lifting of the resist. It is important not only to produce a good etch at a given window, but also that the etch result is uniform, both across a given wafer and from one wafer to another. Better uniformity is obtained by use of a highly dilute BOE concentration dispensed at high rotation speed and low flow rate. In particular, the respective values of approximately 50:1, 500 rpm, and 1200 sccm are preferred, with the atomization pressure fixed at 45 psi. The time window on the dispense of BOE is to account for differing etch rates over time.

The BOE concentration of 50:1 is a far more dilute chemistry than is common, almost an order of magnitude so, when compared to the more usual 6:1 or 7:1 concentrations. A concentration range of 30:1 to 150:1 is preferred, with the ratios of approximately 45 to 60 favored as 50:1 is employed in the preferred embodiment. The values of 500 rpm for rotation speed and 1200 sccm for flow rate are, respectively, at the extreme high and low edges of the parameter space available in the FSI. By use of these parameter values well beyond the common range normally applied, the process produces a much better yield by making the etch more uniform across the wafer. It is believed this is because these values help ameliorate etch rate disparities due to the geometry of both the FSI device and the photoresist upon the wafer. Within the photoresist, more concentrated BOE produces a faster etch, but at the cost of less uniformity between dense and isolated regions. A higher flow rate also produces a faster etch, but the combination of a low flow rate and high rpm helps to offset inherent variations in the device due to the geometry of how the BOE is dispensed. This produces a more uniform result both across a given wafer and also between different wafers. In an alternate embodiment which did not employ a spray tool, such as the FSI, but instead a bench, dilute BOE with surfactant could be used, however, the surfactant, used to wet the surface, is considered an added contaminant and would then have to be removed during the remaining clean operations.

Device yield and reliability depend upon both the amount of etch and its uniformity. Although it is desirable to maximize both device properties, these may be contradictory aims. In practice, the processing uses a trade off where reliability is maximized while maintaining yield above a prescribed minimum. This is shown in FIGS. 4a through 4c.

Figure 4A:
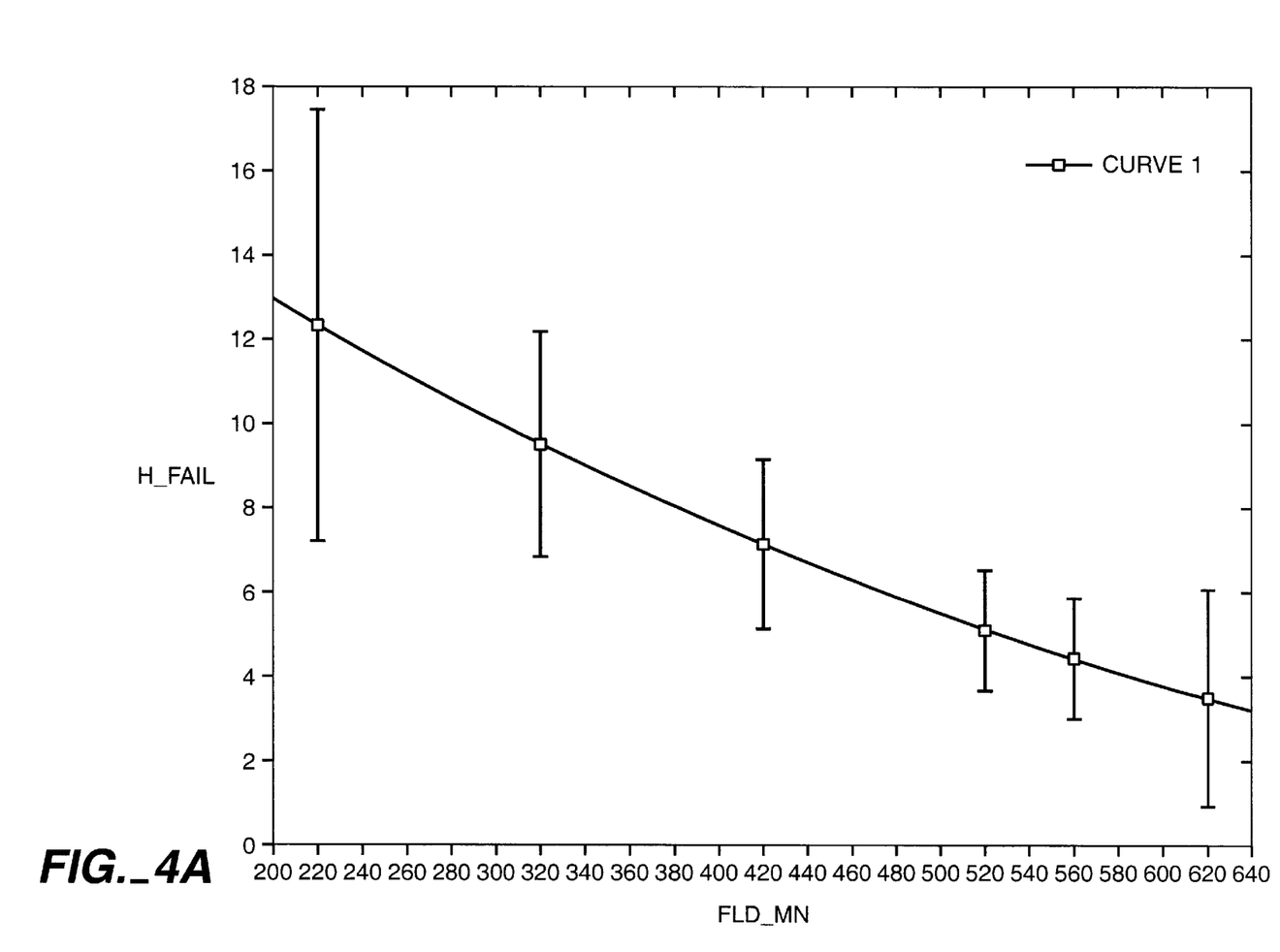
FIGS. 4a through 4c show how device yield and reliability vary with variation in etch.

FIG. 4a shows how yield varies with the amount of filed oxide removed during the etching process. Yield is measured in terms of "hard fails" per wafer, that is, the number of device transistors which fail to function at time zero: the lower the number of hard fails, the higher the yield. The extent of etching which occurs is in terms of the mean amount of field oxide removed as measured in angstroms. This mean field oxide is a reference oxide included on the wafer to monitor process steps. In particular, it is employed here to quantify etch properties. The use of a reference oxide to monitor the etch process is needed since, in tunnel formation, the actual EEPROM oxide is etched back to the substrate, and therefore can not provide an accurate indication of overetch. As shown in FIG. 4a, the number of hard fails decreases, and yield therefore increases, monotonically with the amount of etch. The error bars are included to model the amount of variation about a given modelled point.

Figure 4B:
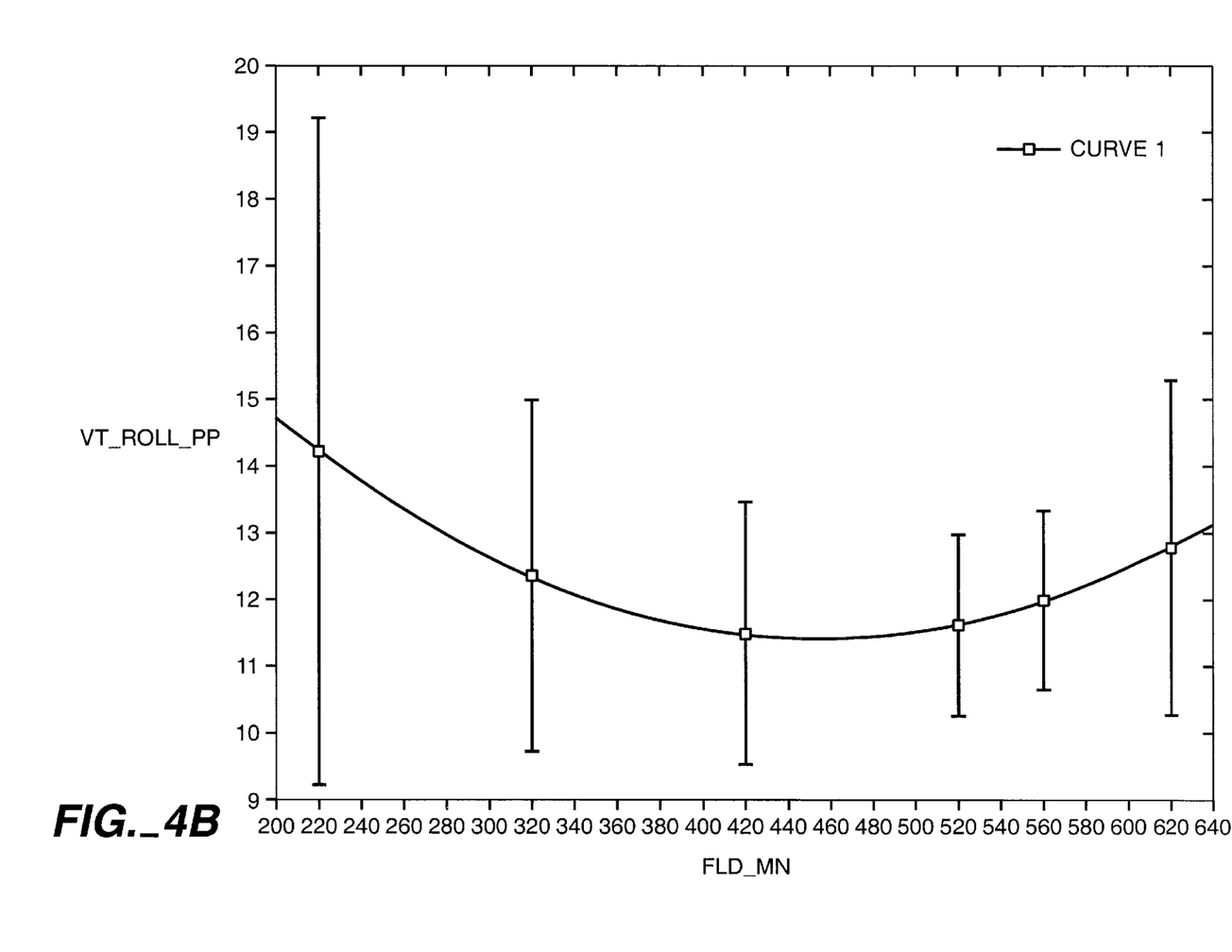
Figure 4C:
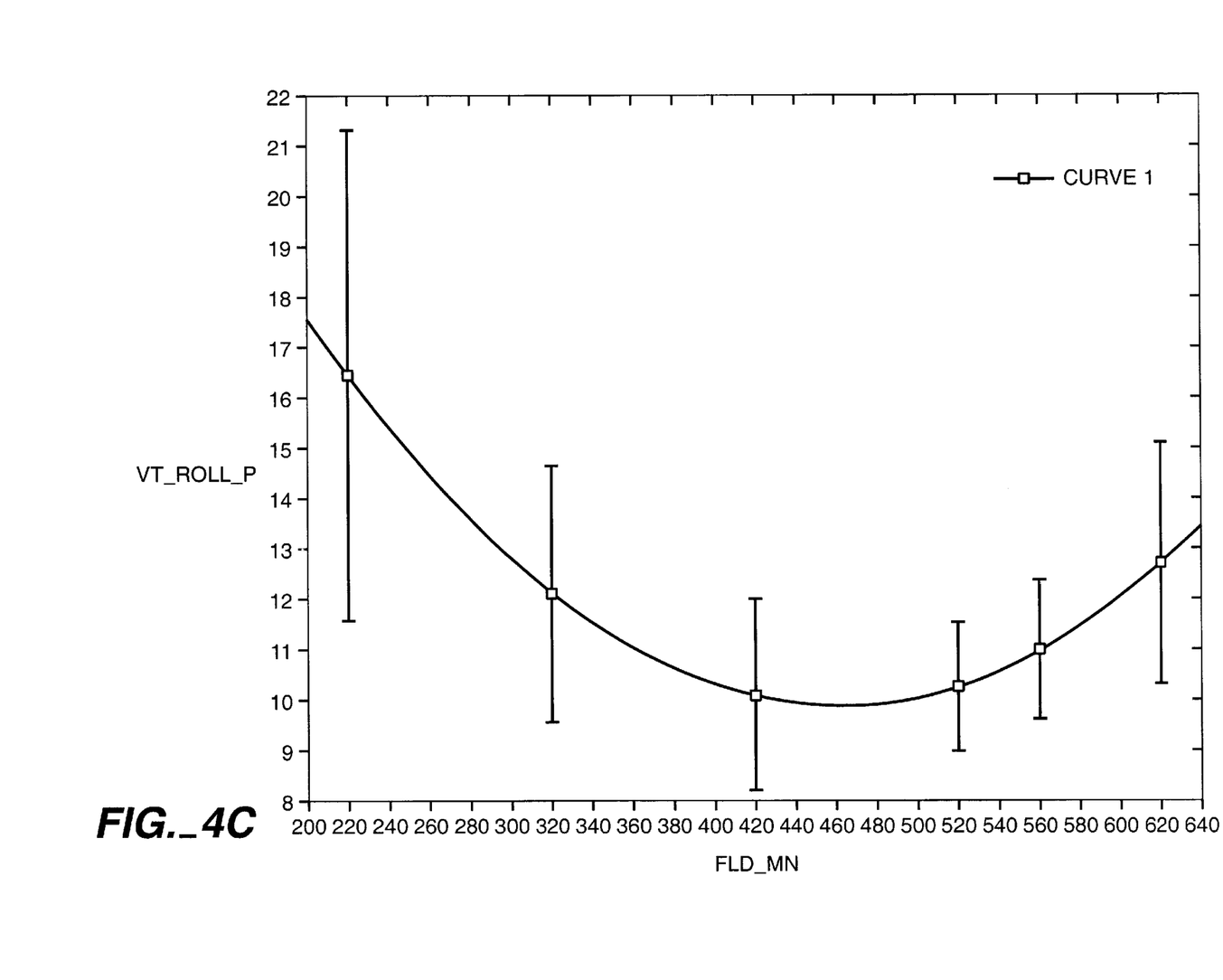

The variation of reliability with etch is shown in FIGS. 4b and 4c. The X-axes are again the amount of reference oxide removed. The Y-axes are now the rolloff values for the threshold voltages, $V_{roll}$. $V_{roll}$ indicates the inability of a device to maintain a charge, and is thus a measure of reliability. The two graphs of FIGS. 4b and 4c are for two different devices on the chip whose reliability is particularly important. Both show a minimum in the etch range of 380–520 Å, centered at approximately 460 Å, all values beyond the approximately 300 Å etched from EEPROM oxide to form the tunnel area. These values give the best reliability, both in terms of the curve and in terms of the spread of data about the curve.

That the graphs for reliability, FIGS. 4b and 4c, have a minimum, while the graph for yield, FIG. 4c, continues downward, requires a compromise between the aims of maximizing both reliability and yield. A certain amount of loss for the yield, as long as below a maximum value, must be offset against improved reliability. Therefore, the amount of etch is preferred to lie somewhat to the right of the minima of FIGS. 4b and 4c, tending to err on the side of more etch. A range of 515 Å to 615 Å (i.e., 215 Å to 315 Å in excess of the amount of EEPROM oxide removed to form the tunnel area), centered about the preferred value of 565 Å, is favored.

Using the 50.1 concentration of BOE, Table 4 compares the uniformity of etch for several values of flow rate and rotation speed. The quantity σ represents the standard deviation of the mean field oxide removed. This value of σ gives variations in uniformity of the etch process, as measured in the amount of mean field oxide removed at selected reference points on the wafers. The values of 500 rpm and 1200 sccm yield the lowest value of σ which is increased if either flow rate is increased or rotation rate decreased. The values of 500 rpm and 1200 sccm are at the limit of the parameter space available in the preferred embodiment employing the FSI machine, with the implication that going beyond this range could further improve uniformity.

TABLE 4

| flow rate (sccm) | rotation rate (rpm) | σ |
|---|---|---|
| 1200 | 250 | 12.587 |
| 1700 | 250 | 11.080 |
| 2200 | 250 | 7.322 |
| 1200 | 330 | 7.193 |
| 1700 | 330 | 6.526 |
| 2200 | 330 | 7.887 |
| 1200 | 500 | 6.132 |
| 1700 | 500 | 6.994 |
| 2200 | 500 | 11.312 |

Figure 5:
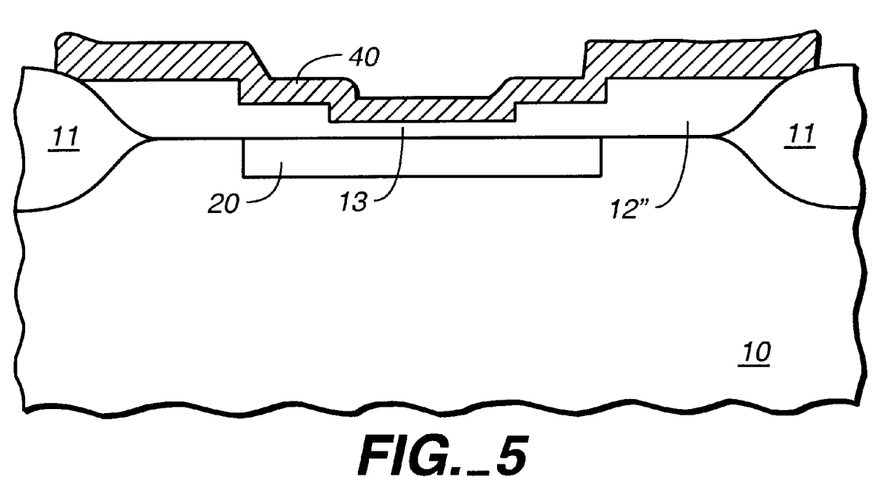
FIG. 5 shows the end result of the process for a preferred embodiment as the tunnel oxide in an EEPROM.

The preferred embodiment of the current invention is in the production of the tunnel oxide of an EEPROM memory cell. Once the etch, resist removal, and preclean is complete the tunnel oxide may be grown as shown in FIG. 1f. A preferred arrangement is shown in FIG. 5, where the tunnel oxide 13 is in the center portion of the EEPROM oxide 12". The dimensions of the preferred embodiment are a width of 1.6–2.0 μm for the entire oxide with a thickness of 300–400 Å, with respective values of 1.8 μm and 350 Å preferred, and a tunnel portion with a thickness of 60 to 110 Å and width of 0.4–0.8 μm, with respective values of 85 Å and 0.6 μm preferred. The other labelled portions of FIG. 5 are the P-well oxides 11, the arsenic implant layer 20, and an amorphous silicon layer 40 grown over the tunnel oxide. The slight thinning of the EEPROM oxide 12" near the tunnel oxide 13 is a result of the arsenic implant procedure and is not discussed here.

It is to be understood that while the invention has been described above in conjunction with preferred specific embodiments, the description and examples are intended to illustrate and not limit the scope of the invention, which is defined by the scope of the appended claims.

It is claimed:

1. A method of forming a semiconductor device, comprising:
    forming a first oxide on a region of the semiconductor body;
    forming a patterned photoresist on an area of the first oxide;
    performing in-situ using wet processing a sequential process comprising:
        etching away the first oxide to the substrate of the semiconductor in a portion of said area using the photoresist;
        stripping the photoresist; and
        pre-cleaning the resultant structure;
    forming a reference oxide on the semiconductor body; and
    etching the reference oxide concurrently with said etching away the first oxide to the substrate, wherein said etchings are performed until the amount of reference oxide removed in excess of the amount of first oxide removed is within a range of from 215 Å to 315 Å.

2. A method of forming a semiconductor device, comprising:
    forming a first oxide on a region of the semiconductor body;
    forming a patterned photoresist on an area of the first oxide;
    performing in-situ using spray processing a sequential process comprising:
        etching away the first oxide to the substrate of the semiconductor in a portion of said area using the photoresist;
        stripping the photoresist using an acid based stripping process; and
        pre-cleaning the resultant structure;
    forming a reference oxide on the semiconductor body;
    etching the reference oxide concurrently with said etching away the first oxide to the substrate, wherein said etchings are performed until the amount of reference oxide removed in excess of the amount of first oxide removed is within a range of from 215 Å to 315 Å; and
    subsequent to said in-situ sequential process, forming a second oxide on at least a part of said portion of said area, wherein the second oxide serves as a tunnel oxide of the semiconductor device.

* * * * *